United States Patent [19]

Miyamoto

[11] 4,032,854
[45] June 28, 1977

[54] AMPLIFICATION AND GAIN CONTROL CIRCUIT

[75] Inventor: Seiji Miyamoto, Yao, Japan

[73] Assignee: Sanyo Electric Co., Ltd., Osaka, Japan

[22] Filed: Mar. 12, 1976

[21] Appl. No.: 666,509

[30] Foreign Application Priority Data

Mar. 12, 1975 Japan .............. 50-33833[U]

[52] U.S. Cl. .............................. 330/29; 330/145
[51] Int. Cl.² ................................ H03G 3/30
[58] Field of Search ............ 325/319, 4 B, 414; 330/29, 145

[56] References Cited

UNITED STATES PATENTS

| | | | |
|---|---|---|---|
| 3,177,439 | 4/1965 | Tulp et al. .............. | 330/29 X |
| 3,571,721 | 3/1971 | Jabbar .................... | 330/29 X |
| 3,633,119 | 1/1972 | Balbes .................... | 330/29 X |
| 3,743,770 | 7/1973 | Vidovic ................... | 330/29 X |

Primary Examiner—Rudolph V. Rolinec
Assistant Examiner—Lawrence J. Dahl
Attorney, Agent, or Firm—Armstrong, Nikaido & Marmelstein

[57] ABSTRACT

An amplification and gain control circuit is disclosed in which there is provided in the output circuit of an amplification circuit receiving a gain control input, a semiconductor junction capacitance whose capacity is increased when the amplification circuit receives a gain control input causing gain to be reduced, whereby attenuation of the amplification circuit is assisted and the gain control sensitivity is improved, and which also acts to protect subsequent stages from variations of the direct current value which may occur due to the variation of gain by the amplification circuit.

5 Claims, 6 Drawing Figures

AMPLIFICATION AND GAIN CONTROL CIRCUIT

BACKGROUND OF THE INVENTION

The present invention relates to an amplification circuit provided with automatic gain control means. More particularly the invention relates to an amplification circuit in which there is improved sensitivity of automatic gain control and in which action of the automatic gain control means does not cause variation of the DC voltage level in the output stage of the amplification circuit.

In a conventional circuit for amplification of an AC signal input an AC signal source S supplies an input to the bases of a pair of NPN transistors Q2 and Q3 which constitute a differential amplifier A, and whose collectors connect respectively through resistors R2 and R3 to a line +Vcc which is positive with respect to ground, and to active elements in the next stage. In the particular example shown in FIG. 1 the bases of NPN transistors Q4 and Q5 are connected to source s, the collectors are connected to line +Vcc and the emitters are connected to ground through resistors R4 and R5 respectively. The circuit forms an emitter follower amplifier for buffer purposes, an amplified AC signal output being taken out across the emitters of transistors Q4 and Q5. The emitters of both transistors Q2 and Q3 connect to the collector of an NPN transistor Q1 whose emitter connects to ground through a resistor R1 and to whose base is supplied automatic gain control input, referred to below simply as an AGC input. The AGC input may be proportional to the output of the amplification circuit or to input volume, as required, and is supplied, suitably as a negative-going input, to transistor Q1 by known means not shown. In this circuit a lowered AGC input to the base of transistor Q1 results in reduction of collector current of transistors Q2 and Q3, i.e., in reduced gain by the amplification circuit.

However, this gain control action in a conventional circuit also results in considerable variation of the DC level in the output, and it is difficult to maintain a balance of the requisite values of characteristics of transistors Q2 and Q3, with the result that there is frequently distortion or clipping of signals in subsequent stages connected to the amplification circuit.

SUMMARY OF THE INVENTION

Such problems are overcome by the present invention by means of a circuit wherein there is provided between an amplification circuit receiving an AGC input and a subsequent stage, a semiconductor junction capacitor means which as well as serving as a direct current block between the amplification circuit and subsequent stage improves AGC sensitivity of the amplification circuit.

BRIEF DESCRIPTION OF THE DRAWINGS

A better understanding of the present invention may be had from the following full description of several preferred embodiments thereof when read in reference to the attached drawings in which like numbers refer to like parts.

DETAILED DESCRIPTION OF THE PREFERRED EMBODIMENT

Figure 1:
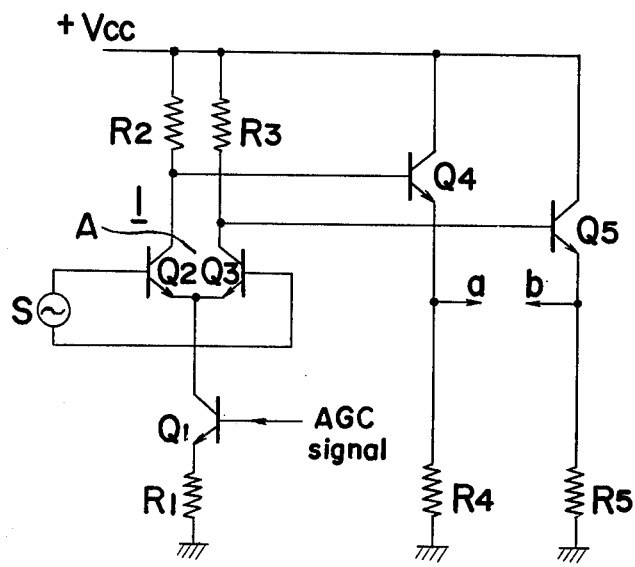
FIG. 1 is a circuit diagram of a conventional circuit referred to in the preceding description.
Figure 2:
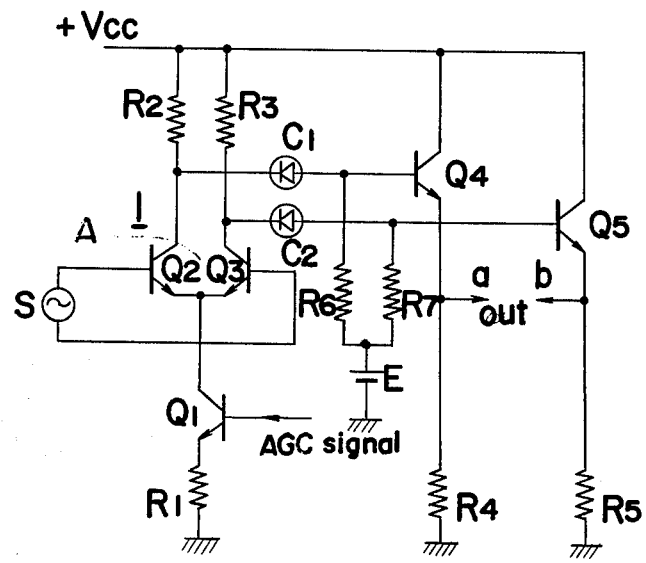
FIG. 2a is a circuit diagram of an amplification circuit including automatic gain control means according to a 1st embodiment of the invention.
FIG. 2b is the same circuit as FIG. 2a showing examples of values of circuit elements.
Figure 2:
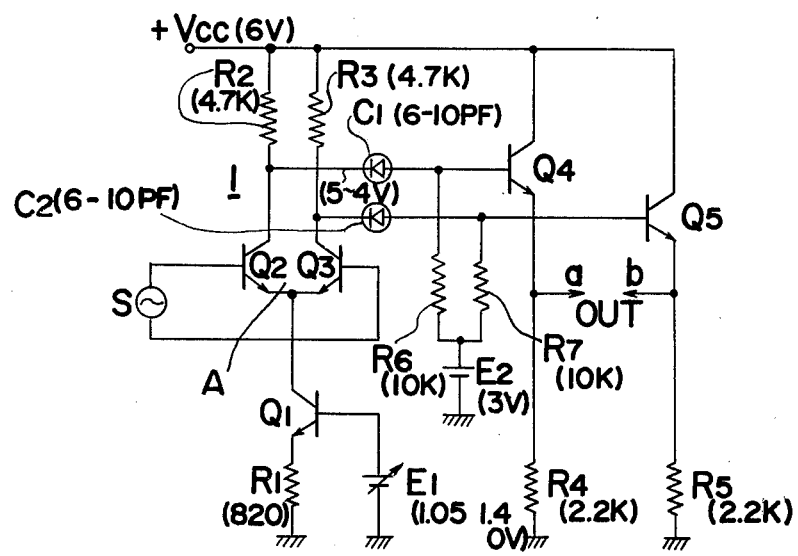

Referring to FIG. 2a, which for convenience of description shows an amplifier A connected to the same passive elements as the amplifier of FIG. 1. In the output circuit of amplifier A there is provided semiconductor junction capacitances C1 and C2, respectively having anodes connected to the collectors of transistors Q2 and Q3 and cathodes connecting to the bases of transistors Q4 and Q5 in the next stage, each of said anodes being defined as a terminal of higher voltage than that of each of said cathodes in the application of reverse bias to the PN junction thereof. Junction capacitances C1 and C2 suitably have the same construction and characteristics. The upper end of resistor R6 connects to a point between junction capacitance C1 and the base of transistor Q4. Resistor R7 is similarly connected to the base of transistor Q5, and suitably has the same value as resistor R6. Bias to transistors Q4 and Q5 is supplied through resistors R6 and R7 by a DC source E. The bias supplied by DC source E is set to be such that it is lower than the collector voltage of transistors Q2 and Q3 during maximum amplification by the amplifier A, whereby junction capacitances C1 and C2 are always reverse-biased. In this circuit signals produced at the collector of transistor Q2 are divided by junction capacitance C1 and resistor R6 and supplied to the base of transistor Q4. Similarly input to transistor Q5 from transistor Q3 is divided by junction capacitance C2 and resistor R7. Representing resistance of each resistor R6 and R7 by $Zr$ and impedance of each junction capacitance at the frequency of the input signal supplied from signal source S by $Zc$ amplitude of a signal supplied to either transistor Q4 or Q5 is proportional to $$(Zr)\sqrt{Zr^2 + Zc^2}$$

If voltage of base bias supplied to transistor Q1 is lowered, in order to reduce gain of amplifier A, collector current of amplifier transistors Q2 and Q3 is reduced. The voltage drop over resistors R2 and R3 is thus reduced, and voltage at the anodes of junction capacitances C1 and C2 becomes closer to that of the +Vcc line, i.e., since supply from DC source E is constant, reverse bias of junction capacitances C1 and C2 are increased. The impedance $Zc$ therefore increases and there is increased attenuation of signals supplied to buffer transistors Q4 and Q5, reduction of gain thus being assisted by increased impedance of junction capacitances C1 and C2. In other words, gain control sensitivity is improved since a given variation of AGC input results in greater variation of gain of amplifier A.

A specific, non-limiting, example of this action is considered in reference to FIG. 2b, in which AGC input to transistor Q1 is identified as voltage supply E1, and bias DC supply to transistors Q4 and Q5 as E2. Supposing $V_{BE}$ of transistor Q1 to be 0.7V, resistor R1 to present a resistance of 8290 Ω, AGC input E1 to be variable in the range 1.05V to 1.40V, resistors R2 and R3 to each present a resistance of 4.7 KΩ and line +Vcc to be 6V positive with respect to ground, when AGC input E1 is 1.05V current through resistor R1 is of the order of 0.43 mA, voltage drop across resistors R2 and R3 is of the order of 1V, and the anodes of said junction capacitances C1 and C2 are therefore at a potential of about +5V. If the DC bias input E2 supplied through resistors R6 and R7, each having a resistance of 10 KΩ is +3V reverse bias of capacitances C1 and C2 is of the order of 2V. Construction of junction capacitances C1 and C2 is such that with this reverse-bias each has a capacity of 6 pF. At this time, supposing input signals supplied from signal source S to have a frequency of 3.58 MHz, impedance presented by each capacitance C1 and C2 is 7.42 KΩ, and resultant attenuation of amplifier A output signals is 4.8 dB.

If now AGC input E1 is changed to 1.40V current through resistor R1 goes to 0.86 mA, voltage drop across resistors R2 and R3 to 2V, and potential at the anodes of capacitances C1 and C2 to +4V, i.e., reverse bias of capacitances C1 and C2 becomes 1V. With this reverse bias applied each capacitance C1 and C2 has a capacity of 10 pF and represents an impedance of 4.4 KΩ and resultant attenuation of amplifier A output is 3.2 dB, i.e., 1.6 kB more than when AGC input E1 is 1.05V.

Thus for an approximately 30% variation of AGC input capacitances C1 and C2 contribute to a variation of 1.6 dB in amplifier gain, and gain control sensitivity in the circuit of the invention is improved. In addition to this there is the further advantage that capacitances C1 and C2 act as a DC block between amplifier A and transistors Q4 and Q5 of the next stage, and problems caused by variation of DC values and consequent distortion or clipping of signals in stages subsequent to amplifier A are thereby avoided.

Figure 3:
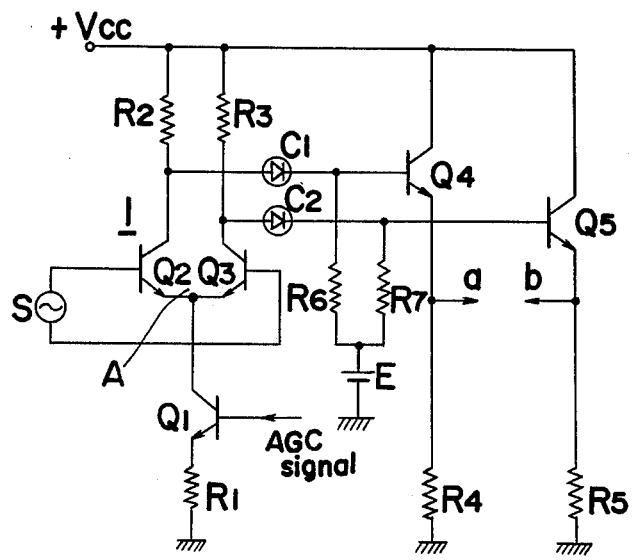
FIG. 3 is a circuit diagram showing a modification of FIG. 2.

Needless to say although the invention has been described above in reference to a so-called reverse or negative going AGC means, circuit action is essentially the same in a so-called forward or positive going AGC means, in which gain is decreased by causing an increase of collector current of the amplifier transistors Q2 and Q3. In this case, since increased collector current of transistors Q2 and Q3 results in lower collector voltage, polarity of each junction capacitance C1 and C2 is reversed as shown in FIG. 3 and bias supplied by DC source E1 is such that voltage at the anodes of capacitances C1 and C2 is lower than collector voltage of transistors Q2 and Q3 at maximum amplification by amplifier A and is higher than collector voltage of transistors Q2 and Q3 at minimum amplification by amplifier A.

Figure 4:
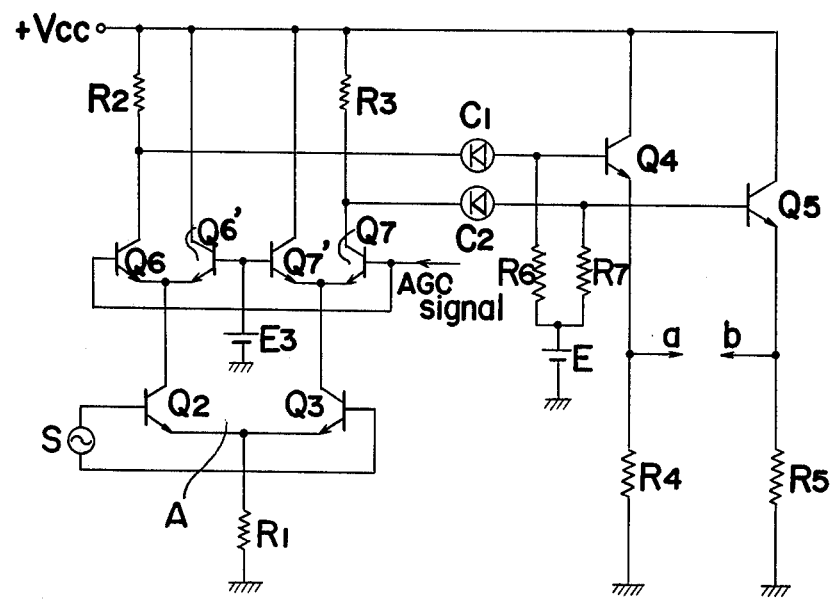
FIG. 4 is a circuit diagram showing employment of the circuit of the invention in a amplification circuit.

Referring to FIG. 4 the circuit of the invention in shown in association with an amplification circuit. In the circuit of FIG. 3, the bases of transistors Q2 and Q3 receive an input from signal source S as before and the emitters thereof are both connected to ground through resistor R1, the transistor Q1 of FIG. 2(a) being omitted. The collector of transistor Q2 is connected to the common emitter circuit of NPN transistor Q6 whose collector connects to the anode of capacitance C1 and to +Vcc through resistor R2, and of NPN transistor Q6' having a collector connected to +Vcc. The collector of transistor Q3 connects to the common emitter circuit of similarly disposed NPN transistors Q7 and Q7'. Fixed voltage E3 is applied to the bases of transistors Q6 and Q7', and AGC signals are supplied to the bases of transistors Q6 and Q7.

Figure 5:
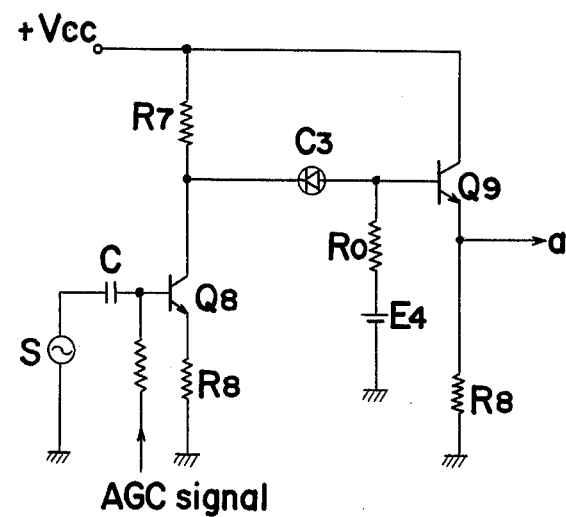
FIG. 5 is a circuit diagram of a 2nd embodiment of the invention.

Although in practice comparatively complex amplification circuits are more commonly employed, the circuit of the invention is equally suited to employment in a simple amplification circuit such as shown in FIG. 5. In this circuit input signals from signal source S are supplied through capacitor C to the base of an NPN transistor Q8 having an emitter connected to ground through resistor R8 and a collector connected to line +Vcc through resistor R9 and to the anode of junction capacitance C3. The cathode of function capacitance C3 is connected to the upper end of resistor R10 through which voltage is applied by fixed voltage source E4 and to the base of NPN transistor 09 constituting the next stage. The collector of transistor Q9 is connected to line +Vcc and the emitter is connected through resistor R8 to ground. AGC input is applied to the base of transistor Q8 via a point between capacitor C and the base of transistor Q8, and input to a subsequent stage is obtained from the emitter circuit of transistor Q9. Also, it is a matter of course to reverse each polarity of capacitors C1, C2, C3, as shown in FIG. 3 when an AGC circuit of reverse type is employed in the circuits of FIGS. 4 and 5.

What is claimed is:

1. In an amplification circuit for receiving alternating current input signals, said circuit comprising at least one amplifying element and at least one output circuit, for coupling said amplification circuit to a subsequent stage through which an amplified output is supplied to said subsequent stage, and a gain control means to control said amplification circuit to maintain the amplitude of said amplified output within a certain range, an amplification and gain control circuit which includes at least one capacitive semiconductor junction means having one end connected to an output electrode said amplifying element and the other end connected to a constant voltage source through a resistor, said constant voltage source applying a reverse bias to said semiconductor junction means and also applying a D.C. bias to said subsequent stage wherein said semiconductor junction means prevents variations in D.C. voltage in the amplification circuit from being applied to said subsequent stage, and wherein the capacitance of said semiconductor junction means is decreased upon actuation of said gain control means to decrease gain by said amplification circuit whereby attenuation of the output of said amplification circuit is enhanced.

2. Amplification and gain control circuit as recited in claim 1, wherein said input supplied by said gain control means is supplied in proportion to said alternating current signals supplied as input to said amplification circuit.

3. Amplification and gain control circuit as recited in claim 1, wherein said input supplied by said gain control means is supplied in proportion to output of said amplification circuit.

4. Amplification and gain control circuit as recited in claim 1, wherein said amplification circuit comprises an NPN transistor having a collector connected through a first resistor to a line on which the potential is at a first positive level with respect to a common base, wherein said output circuit is connected to the collector of said tansistor to form an Automatic Gain Control Circuit of a reverse type for controlling gain in accordance with the decrease of collector current of said transistor, and wherein said alternating current signals are supplied to the base of said transistor, the anode of said semiconductor junction means is connected to the collector of said transistor and the cathode thereof is connected to said subsequent stage via a point which is maintained at a potential which is at a second level which is lower than the level of potential at the collector of sa id transistor during maximum gain by said amplification circuit.

5. Amplification and gain control circuit as recited in claim 1, wherein said amplification circuit comprises an NPN transistor having a collector connected through a first resistor to a line on which the potential is at a first positive level with respect to a common base, wherein said output circuit is connected to the collector of said transistor to form an Automatic Gain Control Circuit of a forward type for controlling gain in accordance with the increase of collector current of said transistor, and wherein said alternating current signals are supplied to the base of said transistor, the cathode of said semiconductor junction means is connected to the collector of said transistor and the anode thereof is connected to said subsequent stage via a point which is maintained at a potential which is at a second level which is lower than the level of potential at the collector of said transistor during maximum gain by said amplification circuit and is higher than the level of potential at the collector of said transistor during minimum gain by said amplification circuit.

* * * * *